United States Patent [19]

Takagi et al.

[11] 4,139,857
[45] Feb. 13, 1979

[54] SCHOTTKY BARRIER TYPE SOLID-STATE ELEMENT

[75] Inventors: Toshinori Takagi, Nagaokakyo; Kiyoshi Morimoto; Yukihiko Utamura, both of Mobara, all of Japan

[73] Assignee: Futaba Denshi Kogyo Kabushiki Kaisha, Chiba, Japan

[21] Appl. No.: 705,696

[22] Filed: Jul. 15, 1976

[30] Foreign Application Priority Data

Jul. 18, 1975 [JP] Japan .................................. 50-87254
Nov. 22, 1975 [JP] Japan ................................ 50-139750
Nov. 22, 1975 [JP] Japan ................................ 50-139751

[51] Int. Cl.$^2$ ..................... H01L 29/48; H01L 29/56; H01L 29/64
[52] U.S. Cl. ........................................ 357/15; 357/30; 427/84; 427/86; 29/589; 29/590
[58] Field of Search ..................... 357/15, 30; 427/84, 427/86; 29/589, 590; 148/175

[56] References Cited

U.S. PATENT DOCUMENTS

| | | | |
|---|---|---|---|
| 2,556,991 | 6/1951 | Teal | 427/86 |
| 2,613,301 | 10/1952 | Dubar et al. | 357/15 |
| 2,847,585 | 8/1958 | Christian | 357/15 |
| 3,049,622 | 8/1962 | Ahlstrom | 357/15 |
| 3,146,138 | 8/1964 | Shirland | 357/15 |
| 3,255,393 | 6/1966 | Hutchins et al. | 357/15 |
| 3,279,962 | 10/1966 | Grimmeiss | 357/15 |
| 3,415,678 | 12/1968 | Gutierrez | 357/15 |
| 3,463,667 | 8/1969 | Chopra | 427/86 |
| 3,597,270 | 8/1971 | Monck et al. | 427/84 |
| 3,864,719 | 2/1975 | Uematsu et al. | 357/6 |
| 4,035,197 | 7/1977 | Raychaudhuri | 357/15 |

Primary Examiner—Andrew J. James
Attorney, Agent, or Firm—Oblon, Fisher, Spivak, McClelland & Maier

[57] ABSTRACT

A Schottky barrier type solid-state element and a method of producing the same, the Schottky barrier type solid-state element comprising a Schottky barrier type element portion consisting of a metallic board and a semiconductor film layer provided on the metallic board, the metallic board being formed of such a metal as can form a Schottky barrier between itself and the semiconductor film layer, and a semiconductor-side terminal electrode provided on the external surface of the semiconductor film layer so as to obtain an ohmic contact therewith, wherein at least the semiconductor film layer is formed by what is called the ionized-cluster-beam deposition process.

1 Claim, 3 Drawing Figures

SCHOTTKY BARRIER TYPE SOLID-STATE ELEMENT

BACKGROUND OF THE INVENTION

The present invention relates to a Shottky barrier type solid-state element for use in a film-shaped solar battery or the like and a method of producing the same.

In a method heretofore employed for producing a semiconductor solid-state element for use in a solar battery or the like, a solid-state element is usually formed by polishing a single-crystal bulk of, for instance, silicon (Si). Therefore, in the conventional method, it is very difficult to form a thin film of semiconductor the thickness of which is on the order of microns; and even if such a thin film is produced, the amount of material that can be utilized will be as low as several percent or less of the total. Moreover, it is very difficult for any conventional technique to provide an excellent Schottky barrier highly qualified for use in a solar battery. For instance, it is considered to be impossible or almost impossible for the conventional C.V.D. process, vacuum evaporation process or sputtering process to produce a high-quality crystalline film and, when a Schottky barrier is to be formed, to control and optimize its microstructure and composition and to make its density sufficiently high and its resistance sufficiently low.

SUMMARY OF THE INVENTION

Therefore, the primary object of the present invention is to eliminate the above-mentioned disadvantages of the prior art and to provide a Schottky barrier type solid-state element high in quality and productivity, thin-film-shaped, light in weight, easy to transport, and suitable for use in a solar battery, and a method of producing the same.

According to the present invention, there are provided a Shottky barrier type solid-state element and a method of producing the same, the Schottky barrier type solid-state element having a Schottky barrier type element portion consisting of a metallic board and a semiconductor film layer provided on the surface of the metallic board, the metallic board being formed of such a metal as can form a Schottky barrier between itself and the semiconductor film layer, the semiconductor film layer being provided on the metallic board so as to form a Schottky barrier therebetween, and a semiconductor-side terminal electrode at least provided on the external surface of the semiconductor film layer of the Schottky barrier type element portion so as to obtain an ohmic contact therewith, wherein at least the semiconductor film layer of the Schottky barrier type element portion is formed by the ionized-cluster-beam deposition process which vaporizes a material (a semiconductor, in this case) to be deposited to form a vapor, injects the vapor into a vacuum region of about $10^{-2}$ Torr or less to form aggregates of atoms of the vapor called clusters, bombards the clusters with electrons to ionize at least a part of the clusters thereby producing ionized clusters, and accelerates the ionized clusters by an electric field to make them impinge on a substrate thereby forming a film layer thereon.

BRIEF DESCRIPTION OF THE DRAWINGS

Other objects, features and advantages will become more apparent from the following description taken in conjunction with the accompanying drawings, in which.

DESCRIPTION OF THE PREFERRED EMBODIMENTS

Figure 1:
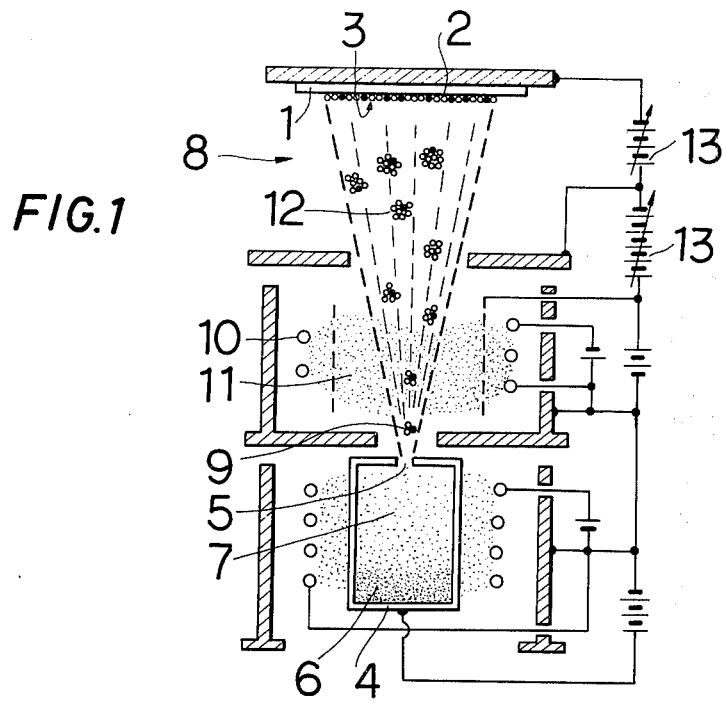
FIG. 1 is a schematical sectional view of an example of the evaporation apparatus for carrying out the ionized-cluster-beam deposition process for use in the method of producing a Schottky barrier type solid-state element according to the present invention, showing the principle thereof.

Referring now to FIG. 1, description will be hereinafter made on one embodiment of the present invention to which the ionized-cluster-beam deposition process is applied.

Reference numeral 1 designates a substrate on the surface 2 of which a single-crystal semiconductor film layer 3 made of, e.g., p-type or n-type silicon is deposited. Numeral 4 designates a closed-type crucible having at least an injection nozzle 5. A material 6 of the semiconductor film layer 3 to be deposited on the substrate 1, that is, a p-type or n-type semiconductor material, for instance, p-type or n-type silicon is placed in the crucible 4, which is then heated up to a high temperature by suitable heating methods such as resistance heating and electron bombardment heating (as shown in FIG. 1) to vaporize the material 6 therein to form a vapor 7 the pressure of which is about $10^{-6}$ to several Torrs. The vapor 7 is then injected from the crucible 4, through the nozzle 5, into a vacuum region 8 kept at a pressure 1/100 or less of the vapor pressure in the crucible 4 and also at about $10^{-2}$ Torr or less. At this time, the vapor 7 is converted into aggregates of atoms called clusters 9 due to supercooling phenomenon caused by adiabatic expansion. One cluster usually consists of about 100 to 2,000 atoms. If one of the atoms constituting each cluster 9 is ionized, an ionized cluster can be formed. Therefore, a filament 10 is provided as a therionic emission source to emit electrons, which impinge on the clusters 9 to produce ionized clusters 12. The ionized clusters 12, while flying together with the non-ionized neutral clusters 9 towards the substrate 1 provided in the route of the clusters, are accelerated by an electric field created by an acceleration power source 13 connected to electrodes positioned at and/or near the substrate 1, and thereby are brought into collision with the surface 2 of the substrate 1 to form a film layer 8 thereon.

In the above-mentioned ionized-cluster-beam deposition process which forms ionized clusters of a material-to-be-deposited and accelerates them to let them impinge on a substrate thereby depositing a film layer thereon, the surface 2 of the substrate 1 is at all times kept clean due to continuous sputter-cleaning action produced by bombardment of the ionized clusters 12, and therefore a very clean and highly adhesive deposition can be achieved. In addition, the ionized clusters 12 are accelerated with a proper high energy given by a high-voltage electric field applied, and therefore, when they impinge on the surface 2 of the substrate 1, their kinetic energy is partly converted into thermal energy, which causes a local temperature rise and thereby enables the film layer 3 of the depositing material to epitaxially grow on the surface 2 of the substrate 1. As mentioned above, the self-heating effect of the surface of the depositing film layer due to the conversion of the kinetic energy of the clusters into thermal energy can independently achieve an excellent crystal growth without any particular external heating of the substrate 1. However, a suitable combination of an increase in the kinetic energy of clusters and application of external heating to the substrate will further increase the single-crystal area and therefore can made to grow a more excellent epitaxial crystal film layer.

Figure 2:
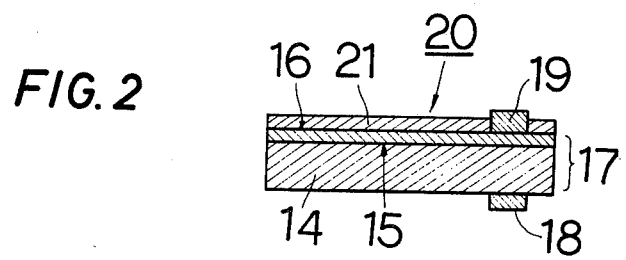
FIG. 2 is a schematical sectional view of the Schottky barrier type solid-state element according to one embodiment of the present invention, showing the essential part thereof for the explanatory purpose.

Referring now to FIG. 2, description will be hereinafter made on the first embodiment of the Schottky barrier type solid-state element used as a solar battery according to the present invention and a method of producing the same.

Reference numeral 14 designates a thin-sheet-shaped metallic board 14 made of such a metal as can form a Schottky barrier between itself and a semiconductor to be deposited thereon. Numeral 16 designates a p-type or n-type semiconductor crystalline film layer deposited on the surface 15 of the metallic board 14 by the above-mentioned ionized-cluster-beam deposition process so that a Schottky barrier may be formed therebetween. Thus an element portion 17 of a Shottky barrier type solid-state element 20 used as solar battery is formed, which consists of the metallic board 14 and the crystalline semiconductor film layer 16. In this case, the metallic board 14 and the semiconductor film layer 16 correspond, respectively, to the substrate 1 and the depositing material film layer 3 described in the case of the ionized-cluster-beam deposition process with reference to FIG. 1. The reference numeral 18 designates a metallic-board-side terminal electrode coated at a suitable portion on the metallic board 14 where the crystalline film layer 16 is not coated. In addition, a semiconductor-side terminal electrode 19 is provided at a suitable portion on the semiconductor film layer 16 coated on the metallic board 14 so as to form a Schottky barrier therebetween, by depositing thereon a metallic film layer made of such a metal as can establish an ohmic contact with the material of the semiconductor film layer 16 using the above-mentioned ionized-cluster-beam deposition process. The stage for forming the metallic-board-side terminal electrode 18 on the metallic board 14 may be carried out either before or after the stage for forming the semiconductor film layer 16 on the metallic board 14, as a matter of course. Moreover, the metallic board 14 may be formed so that a part thereof can be used as the metallic-board-side terminal electrode 18, depending upon the size and shape thereof.

The metallic board 14, at least the upper layer thereof, may be preferably made of gold, chromium, etc. The semiconductor film layer 16 provided on the metallic board 14 so as to form a Schottky barrier therebetween may be formed of a p-type or n-type semiconductor and may preferably have a thickness of several microns to several hundred microns. The metallic film layer of the semiconductor-side terminal electrode 19 provided on the upper surface of the semiconductor film layer 16 so as to establish an ohmic contact therebetween may be preferably made of a metal containing aluminum, indium and others when the semiconductor to be in contact therewith is, for instance, p-type silicon; and a metal containing antimony, etc. when the semiconductor to be in contact therewith is, for instance, n-type silicon.

As mentioned above, the Schottky barrier type element portion 17 is provided at the opposite surfaces thereof with terminal electrodes by the ionized-cluster-beam deposition process disclosed in the above embodiment. Accordingly, when the ionized clusters impinge on the deposition surface, the kinetic energy of the ionized clusters is partly converted into thermal energy, and therefore a very good contact can be established and, in addition, a sufficient ohmic contact can be obtained between the metal and the semiconductor of the element portion coming into contact with each other in a heat processing carried out at a temperature far lower than that applied in the case of the prior art such as the conventional vacuum evaporation process. From the standpoint of the process procedure, this heat processing has an advantage in that it can be performed either during or after the deposition stage using the ionized-cluster-beam deposition process.

Reference numeral 21 designates a reflection preventive film layer properly formed on the upper surface of the element portion 17. The reflection preventive film layer 21 provides a light-receiving layer for effectively absorbing rays incident thereon from the outside, and may be formed by the ionized-cluster-beam deposition process or other various conventional methods. The metallic film layer of the semiconductor-side terminal electrode 19 formed on the upper surface of the element portion 17 can be provided with the function of the reflection preventive film layer 21 concurrently, if the material, conditions, etc. are properly selected.

Thus a Schottky barrier type solid-state element 20 used as a solar battery very high in quality can be produced.

In each stage mentioned above in which the above ionized-cluster-beam deposition process is carried out, it is just the matter of course that the processing condictions such as substrate temperature, intensity of electron current for ionization and the acceleration voltage for ionized clusters should be properly selected so that each deposited film layer may be optimized in adhesion, strength, etc.

As to the stage in the above embodiment where the ionized-cluster-beam deposition process is applied, description has been made on the case where the metallic board 14, on which the semiconductor film layer is deposited so as to form a Schottky barrier therebetween, is made to correspond to the substrate 1 referred to in the ionized-cluster-beam deposition process described with reference to FIG. 1 and where the semiconductor film layer 16 is deposited on this metallic board 14 to form a Schottky barrier; however, on the contrary, the semiconductor film layer 16 may be made to correspond to the above substrate 1, and the material of the metallic board 14 may be deposited on this semiconductor film layer 16.

In the above embodiment, a method of producing a Schottky barrier type solid state element used as a solar battery having a mono-Schottky-barrier type element portion is shown which comprises the steps of depositing a semiconductor film layer on the surface of a metallic board by the ionized-cluster-beam deposition process to form a mono-Schottky barrier type element portion, the metallic board being made of metal at least at the surface thereof, and fixing terminal electrodes on the metallic board and the semiconductor film layer, respectively. However, the present invention is not limited to such embodiment, as a matter of course. For instance, a plurality of laminated element portions similar to the above element portion may be provided between the electrodes in ohmic contact therewith to form what is called the multi-Schottky-barrier type solid-state element, i.e, solar battery, which can be made very thin and highly effective.

Figure 3:
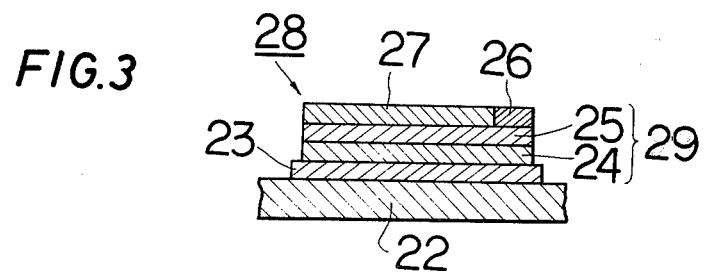
FIG. 3 is a schematical sectional view of the Schottky barrier type solid-state element according to another embodiment of the present invention, showing the essential part thereof for the explanatory purpose.

Reference is now made to FIG. 3, which is a sectional side view of the essential part of a Schottky barrier type solid-state element used as a solar battery according to another embodiment of the present invention. Description will be hereinafter made on this solid-state element used as a solar battery and a method of producing the same.

Reference numeral 22 designates a film-speed or thin-sheet-shaped or flexible film-shaped substrate board made of various organic substances such as polyimide and Mylar, or inorganic insulating materials such as glass and ceramics, or metals. On the upper surface of this substrate board 22, such a metallic film layer as can establish an an ohmic contact with a semiconductor film layer to be subsequently deposited thereon is deposited by the ionized-cluster-beam deposition process as described with reference to FIG. 1 to form a semiconductor-side terminal electrode 23.

After the semiconductor-side terminal electrode 23 is formed, a semiconductor film layer 24 (the thickness of which is, for instance, about several thousand angstroms to several microns) made of n-type or p-type silicon is deposited on the upper surface of the above-mentioned semiconductor-side terminal electrode 23 in a laminated manner by the ionized-cluster-beam deposition process similar to the above-mentioned. In this deposition stage, the substrate board 22 with the semiconductor-side terminal electrode 23 thereon is made to correspond to the substrate 1 referred to in the description on the ionized-cluster-beam deposition process with reference to FIG. 1, and the semiconductor film layer 25 corresponding to the film layer 3 of FIG. 1 is deposited on the semiconductor-side terminal electrode provided on the substrate board 22, by the ionized-cluster-beam deposition process.

After the above deposition stage is completed, a metallic board 25, the thickness of which is about several hundred angstroms to several microns, formed of such a metal film layer as can form a Schottky barrier between itself and the semiconductor film layer 24 is deposited on the upper surface of the semiconductor film layer 24 by the ionized-cluster-beam deposition process similar to the above-mentioned. Thus a Schottky barrier type element portion 29, consisting of the metallic board 25 and the semiconductor film layer 24, is formed.

After the above deposition process is completed, a current-collecting metallic-board-side terminal electrode 26, comb-shaped, wire-shaped or the like, is provided on the upper surface of the metallic board 25, and a reflection preventive film layer 27 is provided at a proper portion on the upper surface of the metallic board 25.

As mentioned above, the silicon film layer is formed by the ionized-cluster-beam deposition process, in which, when the ionized clusters impinge on the deposition surface, its kinetic energy is partly converted into thermal energy. Therefore, the silicon film layer thus deposited shows good crystalline properties, and can provide a sufficient ohmic contact with the metallic film layer being in contact therewith, by a heat processing carried out at a temperature far lower than that applied in the conventional method.

In each stage mentioned above in which the ionized-cluster-beam deposition process is carried out, it is just the matter of course that the processing conditions such as substrate temperature, intensity of electron current for ionization, and acceleration voltage for ionized clusters should be properly selected according to the substrate material, the surface condition and depositing material of each film layer, etc. so that each deposited film layer may be optimized in quality, adhesion, strength, etc.

The embodiment shown above is concerned with a Schottky barrier type solid-state element having a set of laminated film layers. More particularly, as mentioned above, the method of producing such a solid-state element comprises the steps of forming a semiconductor-side terminal electrode, formed of such a metal film layer as can establish an ohmic contact with a semiconductor to be subsequently deposited thereon, on a substrate board; forming a semiconductor film layer on the semiconductor-side terminal electrode; and providing a metallic board, formed of such a metallic film layer as can form a Schottky barrier between itself and the semiconductor film layer, on the semiconductor film layer. However, the present invention is not limited to this embodiment, and the above sets of steps may be repeated to form a plurality of sets of laminated film layers, as a matter of course. In this manner, a solid-state element having a further increased photo-electric conversion efficiency, etc. can be produced.

The Schottky barrier type solid-state element thus produced has a construction in which a very high-quality and film-shaped Schottky barrier type semiconductor element is provided on the substrate board 22. Therefore, if the substrate board 22 is formed of a flexible film, the solid-state element as a whole can be made sufficiently flexible and therefore free from fatigue due to folding or rolling-up.

In the above embodiment of the present invention, the ionized-cluster-beam deposition process is used for each of the deposition stages of the semiconductor-side terminal electrode 23, the semiconductor film layer 24 and the metallic board 25, and thereby the adhesion of each film layer is remarkably increased and the product quality is much improved. In this case, it is necessary that the ionized-cluster-beam deposition process should be applied at least to the deposition stage of the semiconductor film layer 24.

As mentioned above, the substrate board 22 is preferably made of thin-sheet-shaped or flexible film-shaped organic substance such as Mylar or Polyimide, or thin-sheet-shaped inorganic substance such as glass or ceramics, or film-shaped or thin-sheet-shaped metal. Of these various shapes and materials, a proper one may be selected according to the purpose and use of the Schottky barrier type solid-state element to be produced.

The metallic film of the semiconductor-side terminal electrode 23 is preferably made of a metal containing, for instance, aluminum and indium when the semiconductor film layer 24 in contact therewith is of p-type silicon, and a metal containing, for instance, antimony when the semiconductor film layer 24 is of n-type silicon.

The metallic board 25 is preferably made of gold, chromium, etc.

The semiconductor-side terminal electrode 23 and the metallic board 25 are in ohmic contact with the semiconductor film layer 24 and the metallic-board-side terminal electrode 26, respectively.

The reflection preventive film layer 27 shown in the above embodiment is provided to form a light-receiving surface for effectively absorbing rays incident thereon from the outside, when the solid-state element is used as a solar battery; and is formed on the upper surface of the solid-state element by the ionized-cluster-beam deposition process of the present invention or other various methods. Instead of providing the reflection preventive film layer 27, the metallic-board-side terminal electrode 26 may be so formed that it can concurrently perform the reflection preventive function.

It will apparent from the foregoing description that the present invention is concerned with the Schottky barrier type solid-state element which is produced by depositing at least the semiconductor film layer in a laminated manner by the ionized-cluster-beam deposition process and is highly suitable for use in a solar battery or others.

Various features and effects of the present invention are enumerated as follows:

(1) In the ionized-cluster-beam deposition process used in the present invention, the substrate surface is at all times kept clean due to the sputter-cleaning action of ionized clusters during deposition, and therefore a deposited film can be made very high in adhesion and quality.

(2) Since the deposition process of the present invention accelerates the ionized clusters with a suitable high energy created by a high-voltage electric field applied, it can produce what is called the self-heating effect of the surface of the depositing film layer which creates a local temperature rise due to partial conversion of the kinetic energy of the ionized clusters into thermal energy when the ionized clusters impinge on the substrate, and also it can produce what is called the migration effect which breaks up the ionized and non-ionized clusters into individual atomic particles and spreads them over the surface of the depositing film layer by the energy they have at the time of impact. Therefore, the deposition process of the present invention can achieve an excellent crystal growth of the depositing material.

Furthermore, in the present invention, the crystal growth of the depositing film layer is carried out while being controlled by the crystalline properties of the substrate, and therefore a Schottky barrier type solid-state element excellent in quality and crystalline properties can be produced.

(3) The deposition process of the present invention can control the acceleration voltage and current during deposition so that the microstructure and composition of the deposition boundary may be optimized. Accordingly, it can increase the deposition density and decrease the resistance at the deposition surface, and therefore can produce a solid-state element whose construction and composition is most suitable for use in a solar battery.

(4) The thickness of the film layer to be deposited on the substrate so as to form a Schottky barrier therebetween can be controlled by properly adjusting the processing conditions during deposition. Therefore, the thickness of the semiconductor film layer positioned upper than the junction, i.e., the Schottky barrier portion can be made less than that formed by the conventional methods. As a result, the wavelength sensitivity range for incident rays is widened and the photovoltaic conversion efficiency is improved.

(5) The deposition process of the present invention for forming the n-type or p-type semiconductor film layer can achieve the concentration control of the depositing material during deposition, which has been difficult to achieve by the prior art. As a result, the present invention can produce a high-performance solid-state element which can effectively take out charged particles produced by light irradiation.

(6) If the terminal electrode provided on the element portion is formed also by the ionized-cluster-beam deposition process as mentioned in the above embodiment, heat processing for obtaining an ohmic contact therebetween can be carried out at a temperature far lower than that applied in the prior art, and thereby can easily provide a connection therebetween with a sufficient ohmic contact, resulting in a high-quality product.

(7) As shown in the embodiment of the present invention, a flexible Schottky barrier type solid-state element, almost impossible to obtain by the prior art, can be produced by forming a film-shaped semiconductor element on a flexible organic film using the ionized-cluster-beam deposition process. The solid-state element thus produced can save its raw materials, and is light in weight, small in size and flexible; and can be folded or rolled up into a compact size, and therefore is easy to handle, transport, store, etc.

(8) The present invention can achieve metal-to-metal multi-layer bonding with strong adhesion, which is considered impossible to achieve by the conventional evaporation processes because of weak adhesion. Especially when the solid-state element is to be used as a solar battery, a multi-layer film suitable for preventing the reflection of incident rays can be formed.

(9) In the above-mentioned embodiment, description was made on the case where silicon was used as semiconductor. However, the semiconductor that can be used in this invention is not limited to silicon alone. Besides silicon, this invention can use other element semiconductors and compound semiconductors such as Ge, GaAs, InP and CdTe to produce a Schottky barrier type solid-state element. When a compound semiconductor is used, the compound semiconductor itself is not necessarily required to be put in the closed type crucible, and a suitable mixture of component elements of the compound semiconductor may be put therein.

Obviously, numerous modifications and variations of the present invention are possible in light of the above teachings. It is therefore to be understood that within the scope of the appended claims, the invention may be practiced otherwise than as specifically described.

What is claimed as new and desired to be secured by Letters Patent of the United States is:

1. A flexible Schottky barrier type solid-state element comprising:
   a flexible film substrate board;
   a first metallic film layer deposited on said flexible film substrate board by the ionized-cluster-beam deposition process wherein a material to be deposited is vaporized into a vapor, injected into a vacuum region of about $10^{-2}$ Torr or less to form aggregates of said vapor called clusters, said clusters are bombarded with electrons to produce ionized clusters, and said ionized clusters are accelerated by an electric field such that they impinge on a surface, thereby forming a film layer of said material on said surface, said first metallic film layer forming an ohmic contact semiconductor-side terminal electrode;
a semiconductor film layer deposited on said first metallic film layer by said ionized-cluster-beam deposition process,
a second metallic film layer deposited on said semiconductor film layer by said ionized-cluster-beam deposition process, said second metallic film layer and said semiconductor film layer forming a Schottky barrier at the boundary therebetween;
a current-collecting metallic-board-side terminal electrode provided on one portion of said second metallic film; and
a reflection preventative film layer provided on another portion of said second metallic film;
whereby said Schottky solid state element can be folded or rolled into a compact size.

* * * * *